US009734896B2

(12) United States Patent
Roine et al.

(10) Patent No.: US 9,734,896 B2
(45) Date of Patent: Aug. 15, 2017

(54) CIRCUITS AND METHODS FOR PERFORMANCE OPTIMIZATION OF SRAM MEMORY

(71) Applicant: TEXAS INSTRUMENTS INCORPORATED, Dallas, TX (US)

(72) Inventors: Per Torstein Roine, Oslo (NO); Vinod Menezes, Bangalore (IN); Mahesh Mehendale, Karnataka (IN); Vamsi Gullapalli, Karnataka (IN); Premkumar Seetharaman, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/199,167

(22) Filed: Jun. 30, 2016

(65) Prior Publication Data

US 2016/0314832 A1     Oct. 27, 2016

Related U.S. Application Data

(63) Continuation of application No. 14/562,056, filed on Dec. 5, 2014, now Pat. No. 9,384,826.

(51) Int. Cl.
*G11C 7/12* (2006.01)
*G11C 11/419* (2006.01)
*G11C 11/4094* (2006.01)
*G11C 7/10* (2006.01)
*G11C 11/412* (2006.01)

(52) U.S. Cl.
CPC ........ *G11C 11/419* (2013.01); *G11C 7/1018* (2013.01); *G11C 7/1039* (2013.01); *G11C 7/12* (2013.01); *G11C 11/4094* (2013.01); *G11C 11/412* (2013.01)

(58) Field of Classification Search
CPC ...................................................... G11C 7/12
USPC ........................................................ 365/203
See application file for complete search history.

(56) References Cited

U.S. PATENT DOCUMENTS

| | | | |
|---|---|---|---|
| 5,600,601 A | 2/1997 | Murakami et al. | |
| 5,659,515 A * | 8/1997 | Matsuo | G11C 11/406 365/222 |
| 5,781,469 A | 7/1998 | Pathak et al. | |
| 5,848,023 A | 12/1998 | Kato et al. | |
| 5,936,909 A * | 8/1999 | Sonoda | G11C 7/1018 365/190 |
| 5,991,223 A * | 11/1999 | Kozaru | G11C 7/1018 365/230.03 |

(Continued)

*Primary Examiner* — Son Mai
(74) *Attorney, Agent, or Firm* — Michael A. Davis, Jr.; Charles A. Brill; Frank D. Cimino

(57) ABSTRACT

In described examples, a memory controller circuit controls accesses to an SRAM circuit. Precharge mode control circuitry outputs: a burst mode enable signal to the SRAM circuit indicating that a series of SRAM cells along a selected row of SRAM cells will be accessed; a precharge first mode signal to the SRAM circuit indicating that a first access along the selected row will occur; and a precharge last mode signal to the SRAM circuit indicating that a last access along the selected row will occur. The SRAM circuit includes an array of SRAM cells arranged in rows and columns to store data. Each SRAM cell is coupled to: a corresponding word line along a row of SRAM cells; and a corresponding pair of complementary bit lines.

14 Claims, 7 Drawing Sheets

(56) References Cited

U.S. PATENT DOCUMENTS

| | | | | |
|---|---|---|---|---|
| 6,115,280 | A * | 9/2000 | Wada | G11C 7/1006 365/189.02 |
| 6,388,937 | B2 * | 5/2002 | Takeyama | G11C 7/1018 365/230.03 |
| 8,174,868 | B2 | 5/2012 | Liaw | |
| 2002/0064075 | A1 * | 5/2002 | Morishima | G11C 7/18 365/203 |
| 2011/0013452 | A1 * | 1/2011 | Watanabe | G11C 7/12 365/185.08 |

* cited by examiner

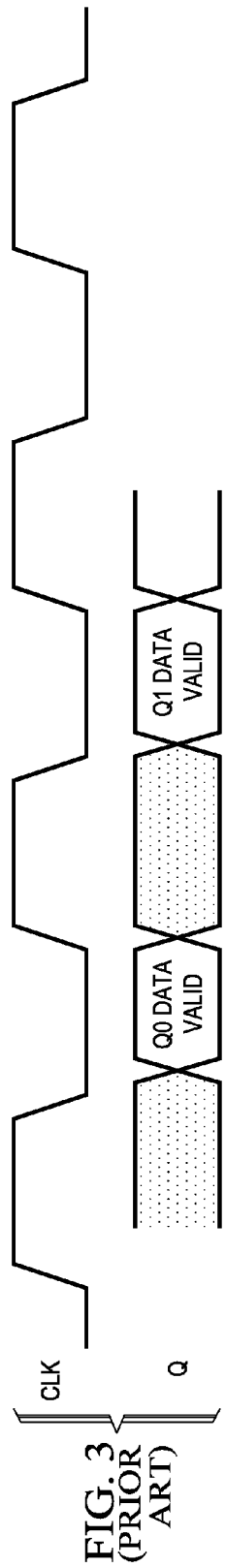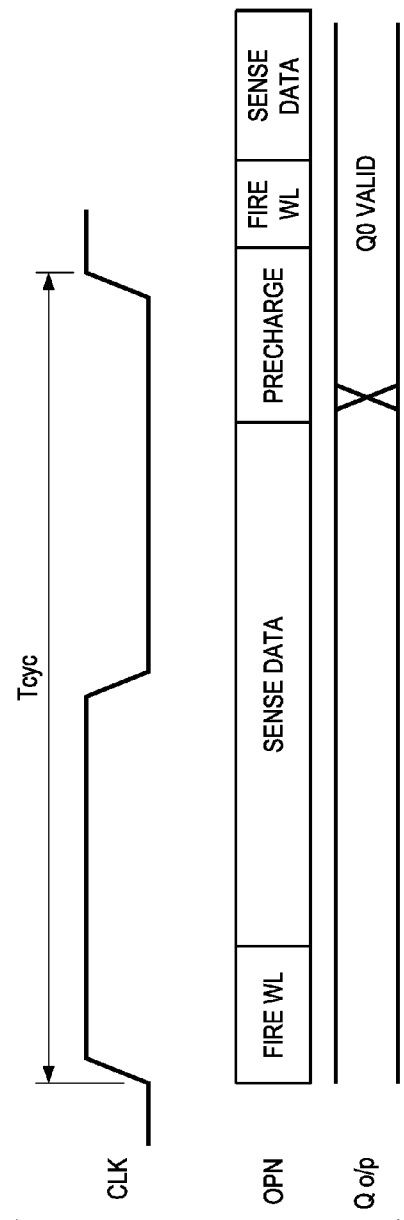
FIG. 3
(PRIOR ART)
FIG. 6
(PRIOR ART)

| PIN NAME | DESCRIPTION | FUNCTION |
| --- | --- | --- |
| BM | BURST MODE ENABLE | WHEN HIGH, MEMORY OPERATES IN BURST MODE. HERE BITLINE PRECHARGE AND WORDLINE FIRING DEPENDS ON EXTERNAL INPUTS PCHF AND PCHL. THIS MODE RESULTS IN REDUCTION IN ACTIVE POWER. BM=0 DISABLES BURST MODE AND MEMORY WORKS IN THE CONVENTIONAL MODE |
| PCHF | CONTROLS BITLINE PRECHARGE | WHEN HIGH, ENABLES BITLINE PRECHARGE IN FIRST HALF OF CYCLE. IS ACTIVE ONLY IN BURST MODE OF OPERATION (BM=1). AS PRECHARGE IS OCCURRING AT THE START OF CYCLE, NORMAL OPERATION WILL GET DELAYED AND WILL LEAD TO PENALTY IN TCYCLE, ACCESS TIME |
| PCHL | CONTROLS BITLINE PRECHARGE | WHEN HIGH, ENABLES BITLINE PRECHARGE IN SECOND HALF OF CYCLE. IS ACTIVE ONLY IN BURST MODE OF OPERATION (BM=1) |

FIG. 11

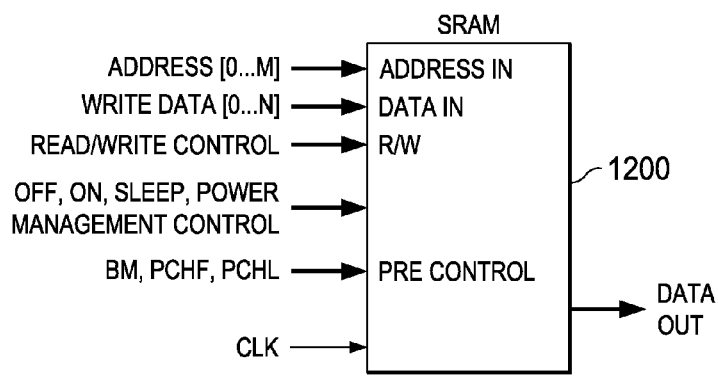

FIG. 12

CIRCUITS AND METHODS FOR PERFORMANCE OPTIMIZATION OF SRAM MEMORY

CROSS-REFERENCE TO RELATED APPLICATION

This application is a continuation of U.S. patent application Ser. No. 14/562,056 filed Dec. 5, 2014, naming Per Torstein Roine et al. as inventors, which is hereby fully incorporated herein by reference for all purposes.

TECHNICAL FIELD

This relates generally to electronic circuitry, and more particularly to optimizing performance of static random access memory (SRAM) devices.

BACKGROUND

SRAM memory devices are increasingly useful for "onboard" data storage for highly integrated circuits, which may form a single chip solution for a particular system. These integrated circuits typically have several functional blocks, which together form a complete system, and are sometimes called a "System on a Chip" or "SOC." Use of SOCs reduces the number of components, the board area, and the interconnections between packaged integrated circuits on a circuit board, thereby increasing performance and reliability and reducing the size of the components. SRAM memory is particularly useful for an SOC as it has the advantages of relatively fast data access and static data storage in a memory, and SRAM maintains the stored data so long as power is present. Dynamic RAM (DRAM) is sometimes used as data storage as it is far denser than SRAM but DRAM has to be refreshed periodically or data errors occur due to inherent leakage currents, and DRAM can have longer data access time. DRAM is also typically manufactured in specialized semiconductor processes, making integration of DRAM on board SOC devices more difficult. In contrast, SRAM cells are easily manufactured within an integrated circuit alongside the other logic circuitry used to form microprocessor or microcontroller blocks, data registers and dedicated functional blocks (such as ALUs and shifters) on an SOC.

FIG. 1 is a block diagram of circuitry for use with SRAM devices. FIG. 1 depicts, as an example of the use of on-board SRAM memory, an SOC for an application such as an "internet of things" or "IoT" application. The SOC has several functional blocks which, in previous devices, might have been provided as separate integrated circuits but which in recent years are increasingly formed together on an SOC. Recently, memory devices and particularly SRAM memories are increasingly included "on board" the SOC.

In FIG. 1, the example SOC includes sensors 101, radio transceivers 103, analog front end or "AFE" 105, power management or "PM" 107, a microcontroller or "µC" 109, nonvolatile memory or "NVM" 111, and static RAM 113. SRAM ("RAM" 113) can be used in any number of applications, and this example SOC 100 is presented for illustration purposes only. Also, SOC 100 can include more, fewer, or different functional blocks. The sensors 101 can be any one of a variety of sensor types such as sensors sensing pressure, temperature, sound, light, user input from a control panel, etc. Radios 103 can implement a variety of interfaces between the SOC 100 and external devices using a variety of over the air interfaces. Examples of over the air interfaces include Bluetooth, WiFi, WiMAX, cellular communications (such as 3G, 4G, LTE), and radio frequency standards (such as used for RFID tags). Analog front end "AFE" 105 can implement a variety of analog to digital conversion functions (such as sigma delta analog to digital converters (ADCs), recursive and pipelined ADCs, and other examples) for receiving analog signals from the sensors, and for outputting digital data for use by other blocks in the SOC. Power management "PM" 107 can implement a variety of power management functions, such as clock speed control, battery management, sleep, wait states, etc. to extend the life of a battery for a portable device application, for example. Microcontroller 109 can be implemented using a wide variety of existing processors provided as cores or macros such as mixed signal processors (MSPs), digital signal processors (DSPs), reduced instruction set machines such as RISC cores, advanced RISC machines such as ARM cores, general purpose microprocessors, and microcontrollers. Simple state machines can also be used as microcontroller 109. Various aspects of example embodiments are compatible with a wide variety of applications. In some applications, portable devices including SOCs typically have sleep, stand by, and other power saving modes typically used in order to preserve battery life. These power saving modes often involve reducing a clock frequency, since lower clock frequencies save power in most integrated circuit devices.

The memory portions of the example SOC 100 include a nonvolatile memory portion NVM 111. NVM 111 can be implemented using EEPROM, E2PROM, FLASH, ROM and even fixed data storage such as hardwired ROM or programmable fuse or anti-fuse data storage. The NVM 111 can be used to store fixed data words, such as program instructions for the microcontroller 109, code words and security keys. Programmable nonvolatile memory such as EEPROM or FLASH can be used in a prototyping environment to develop program instructions for a particular application of SOC 100. Later versions of the SOC 100 can be produced with fixed data in nonvolatile memory, such as a ROM.

RAM 113 can be implemented with an SRAM memory. SRAM memory is increasingly used to store data on board an SOC. The SRAM memory can store register values, computational results, program words and data which need to be retrieved by other blocks in the system. SRAM 113 is typically arranged on a memory bus with an address input, and read/write control line that are latched into the SRAM by a clock input signal. The read operations for the SRAM 113 result in data words that are output from the SRAM 113 which are valid at the end of a memory cycle. Typically, the data valid time will occur sometime before the next rising edge of the clock input signal, so that the system can clock the valid SRAM data as input to other functional blocks. The minimum access time needed for the SRAM to receive the address and read request inputs, decode the address to select an addressed SRAM cell with rows and columns, sense the differential voltage and amplify the data, and output the data, referred to as the memory cycle, can be the limiting factor on the maximum system clock speed for the SOC. Improvements in the SRAM memory cycle time are therefore needed to enable the increase of the operational speed of devices using SRAMs.

FIG. 2 is a block diagram of a conventional SRAM device 200, which is useful in describing conventional operations. SRAM 200 receives as input signals an address field labeled "Address," a data input field labeled "Write Data" used for write operations to the SRAM 200, a read write control input labeled "Read/Write" indicating that a particular access operation is a read or write operation, and a clock signal labeled "CLK." There are various additional control signals input to the SRAM 200 for tailoring the operation of the SRAM 200 for different operating conditions, including input control signals labeled "OFF, ON, Sleep," and other inputs used to reduce or increase the power used in different operating conditions. Power reduction is increasingly important for battery operated portable devices such as tablet computers, smart phones, web browsing devices, digital cameras and camcorders.

FIG. 3 illustrates a timing diagram for an SRAM device such as SRAM 200. FIG. 3 illustrates the memory cycle time in a timing diagram when operating in a READ operation. Following a rising clock edge on the input clock signal CLK, a memory access is performed. During the first portion of the memory access, the data at the outputs of the SRAM 200 is not valid. This is shown by the shading on the output signal Q in FIG. 3. The internal operations of the memory device that occur before valid data being available at the output of the SRAM device include: decoding a first portion of the address field to determine which row of memory cells is being addressed in row decoders, firing the selected word line signal to cause the row of memory cells to share data with columns of complementary bit lines coupled to the SRAM cells, selecting one or more columns (depending on the width of the memory word, which may be a X1, X4, X8, or X16 word width) using a second portion of the address field in column decoders, and enabling the selected columns to be sensed by sense amplifiers using a column select or Y-select multiplexer. The sense amplifiers then latch the differential voltage signal that is on the complementary bit lines and the sense amplifiers amplify the signal to a logic level voltage that is then valid data presented at the data output signals Q of the SRAM 200. The timing diagram in FIG. 3 shows the data arriving at the output as "Q0 Data Valid." In the timing diagram, two sequential data accesses are illustrated. The time that is needed from the rising edge of the CLK signal to the valid data Q0 Data Valid, and Q1 Data Valid, at the outputs is the memory access time, and is sometimes referred to as the performance metric "Clk-to-Q" time.

A conventional SRAM memory access involves several operations that happen internally within the SRAM device 200 in a particular sequence. To further describe the SRAM operations, FIG. 4 depicts in a simple circuit diagram a single memory cell 400 and a precharge circuit 401.

FIG. 4 is a circuit diagram of an SRAM cell. In FIG. 4 a six transistor SRAM cell 400 is depicted. Two cross coupled CMOS inverter devices are formed by the P-type transistor P1 and N-type transistor M1, forming a first inverter, and P-type transistor P2 and N-type transistor M2 forming a second inverter. The cross coupled inverters form a storage latch that stores a datum on nodes SNT and SNC as complementary voltages. Depending on the architecture of the system, the stored voltages can correspond either to a logic one or to a logic zero. Two access transistors labeled IN1 and IN2 selectively couple the storage nodes SNT and SNC to two complementary bit lines BLT and BLC when there is a high voltage on the word line WL. Because the four transistors P1, M1, P2, M2 making up the two inverters and the access transistors IN1 and IN2 form a complete SRAM cell, this SRAM cell is known as a "6T" SRAM cell. Aspects of this application can also be applied to SRAM architectures using other arrangements, such as an 8T SRAM cell. 8T SRAM cells include the transistors of FIG. 4 and additionally 8T SRAM cells have separate read and write access ports. In aspects of this application, an SRAM device can be formed using 8T SRAM cells as well as with the 6T SRAM cells shown here.

FIG. 4 further depicts a word line WL shown running horizontally across the SRAM cell 400. The orientation of the word lines or row lines as 'horizontal' refers only to the example circuit diagram, and the bit lines are often described as arranged in a "vertical" direction. However, in an actual physical implementation of the SRAM cells and of SRAM arrays, these signals can be oriented in various ways, and the word line and bit lines can be oriented in any number of directions. In a typical SRAM array, SRAM cells will be arranged along word lines WL. Current SRAM arrays can include thousands, tens of thousands and even more SRAM cells. The example SRAM cell 400 is further coupled to a corresponding pair of complementary bit lines labeled BLT, and BLC, arranged in another direction. In an example SRAM circuit the columns of bit lines can be oriented in a "vertical" direction. In a typical SRAM array, SRAM cells can be arranged along columns, each column having a pair of complementary bit lines. An address directed to the SRAM array specifies a row of cells and a column (or a group of columns) of cells to be written to, or read from, per access to the SRAM device. The SRAM device architecture can be an X1, X4, X8 or X16 architecture, as examples, depending on the number of columns of SRAM cells that are accessed in each cycle.

In operation, a read cycle to access the data (referred to as a "datum") stored in the SRAM cell 400 begins by raising the voltage on the word line or "firing" the word line labeled WL. When the word line WL has a high voltage on it greater than a threshold voltage, the access transistors IN1, and IN2, which can be referred to as pass transistors, turn on and couple the bit lines BLT and BLC to the storage nodes SNT and SNC in the SRAM cell 400. After the access transistors IN1 and IN2 are active, the voltages on the bit lines BLT and BLC will move apart as the differential voltage stored in the SRAM cell 400 is shared with the bit lines. One of the bit lines BLT, BLC will increase by a differential voltage, and the other will decrease, depending on the value of the datum stored as a voltage on the complementary storage nodes SNT and SNC. When the voltage levels on the bit lines spread apart due to being coupled to the storage nodes by a charge sharing operation, the slight difference voltage can be sensed by a column sense amplifier (not shown) coupled to the bit lines BLT and BLC, which will amplify the difference voltage to a full logic level.

The SRAM cell 400 outputs only a small differential voltage onto the bit lines BLT and BLC. Sense amplifiers (not shown) are coupled to the bit lines during a memory access and sense the small differential voltage. Because the differential voltages stored in the SRAM cells are very small signal level voltages, the bit lines are first precharged to a common precharge voltage. In FIG. 4, precharge transistors IP1 and IP2 are shown in precharge circuit 401 and are coupled to the bit lines B/LT and B/LC. Each column of SRAM cells can share a precharge circuit over all of, or a portion of, the SRAM array. When a control signal PRE_BL is active, these precharge transistors couple a voltage supply labeled Vprecharge to both of the bit lines BLC and BLT. Each one of the bit line pairs in an SRAM array requires a precharge circuit (such as circuit 401), but many SRAM cells can be coupled to the columns formed by the bit line pairs and share the same precharge circuit.

In operation, the precharge control signal PRE_BL in a conventional SRAM array is active at least once per memory access cycle, usually at the end of the current memory access cycle and usually before the next memory cycle begins. The precharge voltage Vprecharge can be a voltage between a minimum and maximum supply voltage level, such as Vdd, or Vdd/2. When the control signal PRE_BL is active, the bit lines BLT and BLC are both precharged to this voltage Vprecharge.

FIG. 5 is a block diagram of an SRAM device presented in order to further explain the operation of the SRAM memory devices. In FIG. 5, an array of SRAM cells 501a-501c are shown disposed in a first column, 503a-503c are disposed in a second column, and are arranged in rows a-c with word lines labeled WLa-WLc in an SRAM device 500. An actual production SRAM device may include thousands or tens of thousands of SRAM cells (or more). The word lines WLa-WLc are output by the row decoder ROW DEC. numbered 505. A column decoder labeled COL. DEC. numbered 507 outputs control lines to a multiplexer Y-SEL numbered 509 that receives as inputs bit line pairs BLT0, BLC0 to BLTn, BLCn, and that outputs a pair of complementary Y select complementary outputs labeled YT, YC to a sense amplifier labeled Sense and numbered 513. The sense amplifier 513 latches the differential voltage on the selected bit line pair and outputs the signal DATA.

Each of the true and complement bit line pairs BLT0, BLC0 to BLTn, BLCn, are coupled to a corresponding precharge circuit numbered 5110-511n. A precharge control circuit labeled PRE; and numbered 515, outputs the precharge control signal PRE_BL to the precharge circuits.

In operation, the SRAM 500 memory access cycle begins when a clock signal CLK goes high. The address input signal ADD is latched and row decoder ROW DEC. 505 begins decoding a portion of the address field and outputs a high voltage on a selected one of the word lines WLa-WLc, selected by a portion of the address. The column decoder COL. DEC. 507 begins by decoding a second portion of the address field ADD and outputs a select signal to the Y-sel. multiplexer 509. The Y-sel. multiplexer determines which ones of the bit line pairs BLT0, BLC0-BLTn, BLCn is selected.

When the word line voltage on the selected word line WLa-WLc rises, the complementary bit lines for the SRAM cells along the selected row are coupled to the storage nodes within each of the SRAM cells. The voltages on the complementary bit line pairs in each column begin to spread apart as the differential voltage in the SRAM cells is shared with the bit lines. Each bit line along the active row will take the differential voltage value of the storage nodes of the SRAM cells in the corresponding columns.

The column select multiplexer 509 labeled Y-SEL then couples the selected bit line pair to the complementary output signals YT and YC. COL. DEC. 507 determines which column is selected based on a column portion of the input address ADD. Sense amplifier 513 then receives the differential voltage signal, senses the differential voltage, latches and amplifies it, and outputs the data from the selected SRAM cell on the output data signal DATA.

As described above, the memory access cycle includes several steps performed internal to the conventional SRAM memory 500 during each clock cycle. FIG. 6 is a timing diagram of a memory cycle of an SRAM device such as SRAM memory 500. As shown in FIG. 6, the memory access cycle begins with the "Fire WL" operation by firing a word line determined by the row decoder circuit. When the word line fires, the complementary bit lines receive the differential voltage of the SRAM cells along the selected row. During the "Sense Data" operation, the sense amplifiers receive the data that is represented by the differential voltage on the bit line pairs selected by the Y-sel multiplexer. In the example shown in FIG. 6, a precharge operation "Precharge" is performed after the sense amplifier latches the valid data. The precharge in this example is performed at the end of the memory access cycle. The maximum clock frequency for the input clocking signal CLK that can be used for a particular SRAM memory is determined by the amount of time needed to perform the sequential steps of: decoding the address in the row and column decoders, firing the word line for the selected row, sharing the stored data onto the bit line pairs as a differential voltage, sensing the differential voltage in a sense amplifier, and precharging the bit lines for the next memory access. In order to increase performance of a circuit including an SRAM memory such as the example SRAM 500 shown in FIG. 5, the memory cycle time "Tcyc" should be decreased so that the clock frequency can be increased.

Improvements in the operations of SRAM memory devices, and in particular SRAM memory devices arranged for integration into SOCs or into other highly integrated devices, are therefore needed in order to address the deficiencies and the disadvantages of conventional approaches. Solutions are needed that reduce the memory access cycle time and that reduce the power consumed for the SRAM operations, and which improve the SRAM performance, for example in terms of performance metrics such as the Clk-to-Q access time and SRAM power consumption.

SUMMARY

In described examples, a memory controller circuit controls accesses to an SRAM circuit. Precharge mode control circuitry outputs: a burst mode enable signal to the SRAM circuit indicating that a series of SRAM cells along a selected row of SRAM cells will be accessed; a precharge first mode signal to the SRAM circuit indicating that a first access along the selected row will occur; and a precharge last mode signal to the SRAM circuit indicating that a last access along the selected row will occur. The SRAM circuit includes an array of SRAM cells arranged in rows and columns to store data. Each SRAM cell is coupled to: a corresponding word line along a row of SRAM cells; and a corresponding pair of complementary bit lines.

In described examples, fewer precharges are performed in certain memory access cycles, and shorter memory access cycle times are achieved with lower power consumption.

BRIEF DESCRIPTION OF THE DRAWINGS

FIG. 3 is a timing diagram for an SRAM device.
FIG. 6 is a timing diagram of a memory cycle of an SRAM device.
FIG. 11 is a table illustrating signals used in an example arrangement for providing aspects of the application.
FIG. 12 is a block diagram of an SRAM device incorporating arrangements for providing aspects of the application.

DETAILED DESCRIPTION OF EXAMPLE EMBODIMENTS

Figure 1:
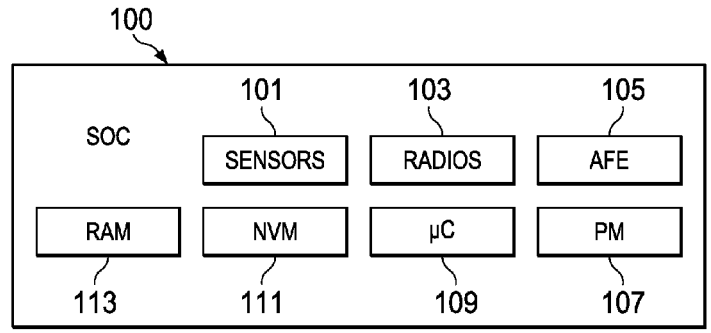
FIG. 1 is a block diagram of circuitry for use with SRAM devices.
Figure 2:
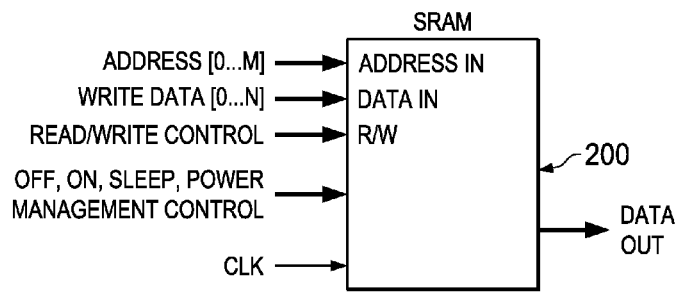
FIG. 2 is a block diagram of an SRAM device.
Figure 4:
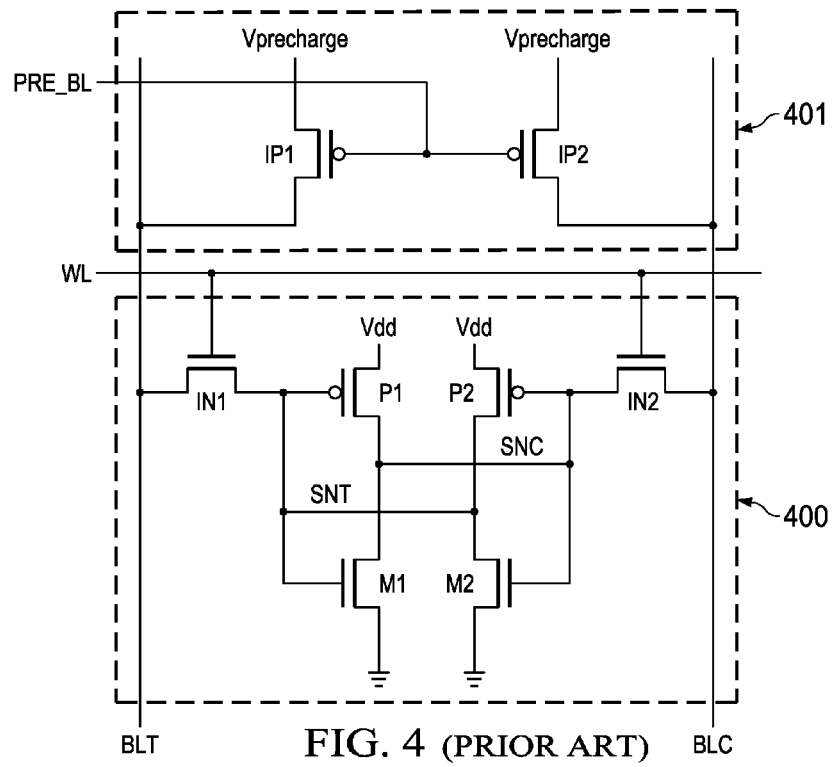
FIG. 4 is a circuit diagram of an SRAM cell.
Figure 5:
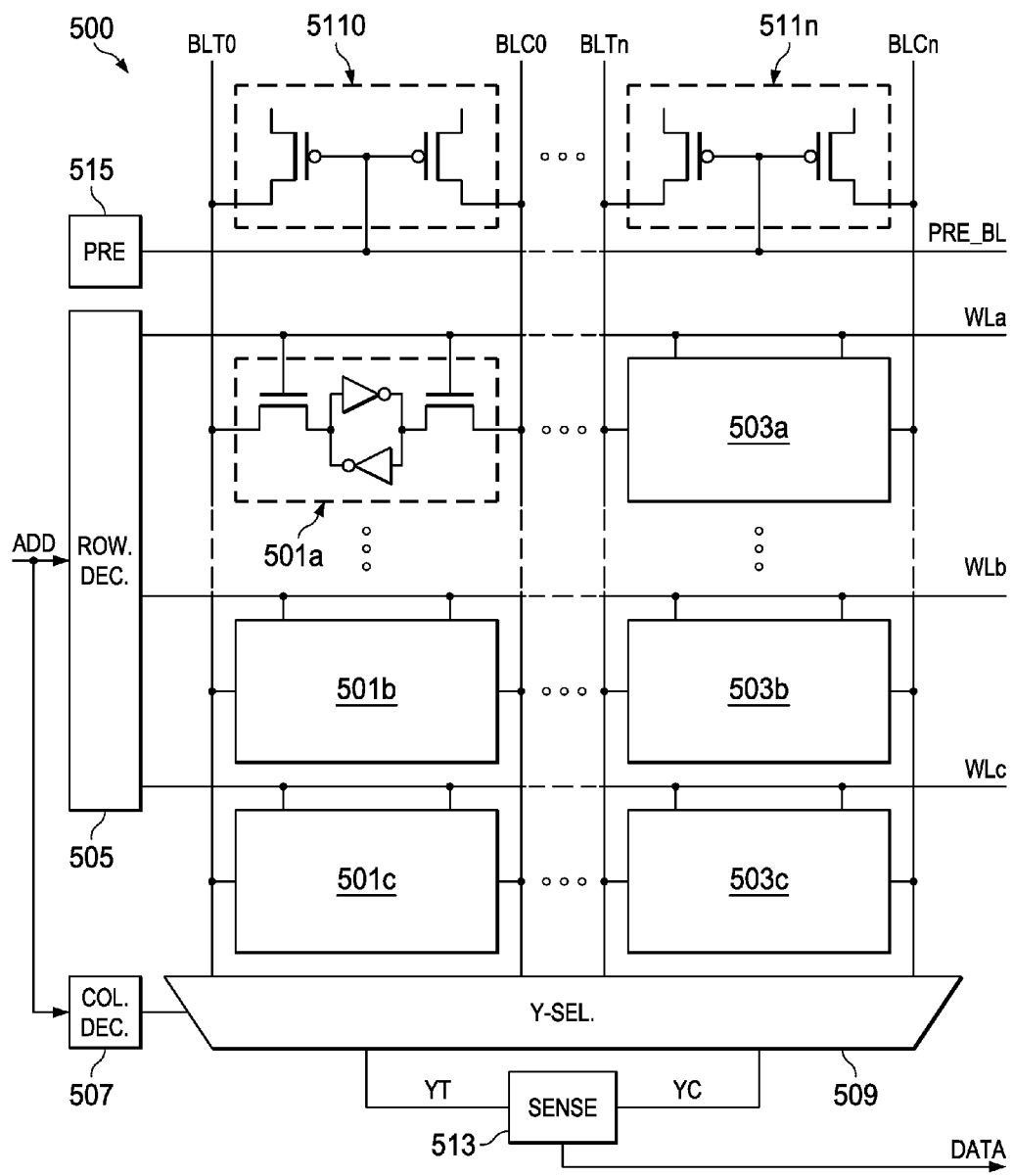
FIG. 5 is a block diagram of an SRAM device.

Corresponding numerals and symbols in the different figures generally refer to corresponding parts unless otherwise indicated. The figures are not necessarily drawn to scale.

In aspects of this application, for many SRAM arrays, the bit line pairs can act as additional data storage nodes. This characteristic aspect of SRAM memory arrays enables various methods and arrangements to be performed, optimizing the performance of SRAM memory devices. In one example method, SRAM memory accesses use only a single word line firing and a single precharge operation for a series of SRAM memory accesses to SRAM cells. In approaches that are aspects of this application, the methodology recognizes that as the word line is fired for a particular row, the data in each SRAM cell along that particular row is transferred to all of the bit line pairs in the corresponding columns coupled to the SRAM cells along that row. It is not necessary to perform another word line firing, or to perform another precharge operation, for each sequential memory access. Instead, the bit lines can be precharged once, the word line can be fired, and the sensed data can be output for each of the SRAM cells until a new complete memory access cycle is needed. The precharge operation is performed again when an access is required to an SRAM cell that is located on a different row in the SRAM array. In methods of example embodiments, the average memory access cycle time can then be substantially shortened over conventional approaches, because the sequential memory access cycles do not require a row decode, word line firing, and precharge operation to be performed for each memory cell access.

In conventional approaches, the SRAM memory accesses were partitioned into system information, and SRAM internal operations. In conventional approaches, the system presents an address and a read/write control signal for each memory access. For write operations, write data is also provided. In previous techniques, SRAM accesses begin on a clock edge, such as a rising clock edge, for the input clock signal. For each memory access, conventional SRAM memory includes internal control circuitry that performs the various internal operations in a manner that is opaque to the system. At a certain time following the rising clock edge, the data at the SRAM outputs (for a read access) is valid and available to the system before the next rising clock edge, so the system can latch the read data and use it in various system operations.

However, in conventional approaches, the system has no control over the internal operations of the SRAM memory. Further, the information available to the system is not available to the SRAM memory. For example, in an example arrangement, the system can know that the next several SRAM operations are to sequential SRAM cell locations in the SRAM memory. However, the control circuitry within the SRAM memory does not receive that information. In conventional approaches, each SRAM read operation was performed in the same manner and without any knowledge of the future operations. Each SRAM data read and data write operation was performed with a decoding operation, a word line firing, a data sense (or data write) operation, and a bit line precharge operation. The time needed for these operations is the same for each SRAM memory operation. The memory cycle time in conventional approaches depends on the total time needed for these operations.

In an aspect of this application, the methodology includes consideration of the internal operations of the SRAM memory device as well as consideration of the system information about future SRAM accesses. In contrast to conventional approaches, in methodology of example embodiments, the internal SRAM operations can be controlled by, or modified by, the system. Further, the system can tailor the internal SRAM operations based on the knowledge about future SRAM accesses, the system clock frequency, and the SRAM architecture and address space. By providing control and/or visibility of the internal SRAM operations to the system, the memory access cycle time can be greatly shortened for certain operations, the overall system performance is advantageously increased by use of example embodiments, and the power consumed by the SRAM memory during operations is also reduced.

Figure 7:
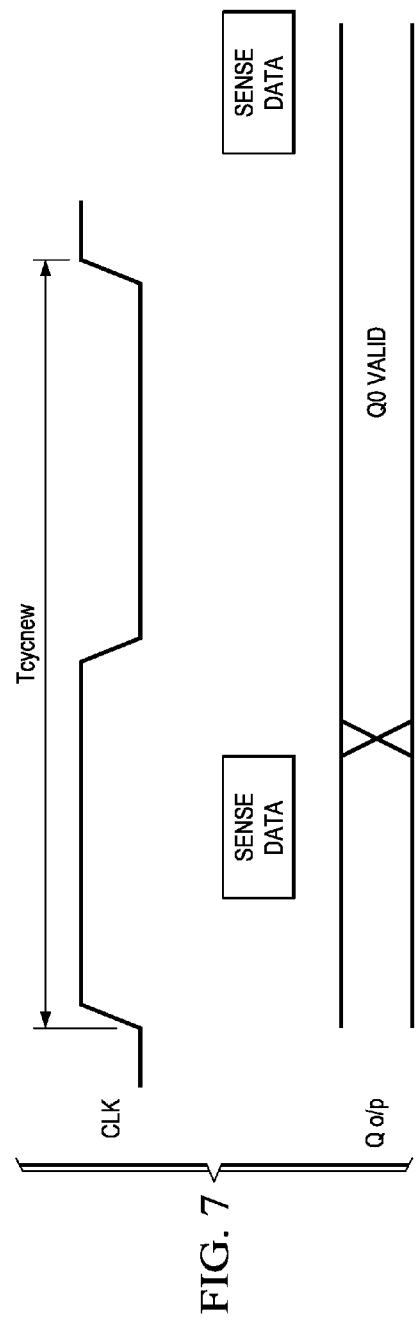
FIG. 7 is a timing diagram of an SRAM device incorporating an aspect of the application.

FIG. 7 is a timing diagram of an SRAM device incorporating an aspect of the application. In FIG. 7, two sequential SRAM read accesses are illustrated. In methods of example embodiments, as sequential memory cell accesses are performed, the word line firing, and the precharge operation are no longer necessarily performed in every memory access cycle. In the particular example of an SRAM operation shown in FIG. 7, sensing and data output operations for sequential SRAM cell accesses are performed without the word line firing and precharge operations required in conventional approaches as shown in FIG. 6 above. Use of the methodologies of this application advantageously enables a shorter memory access time (labeled Tcycnew).

Figure 8:
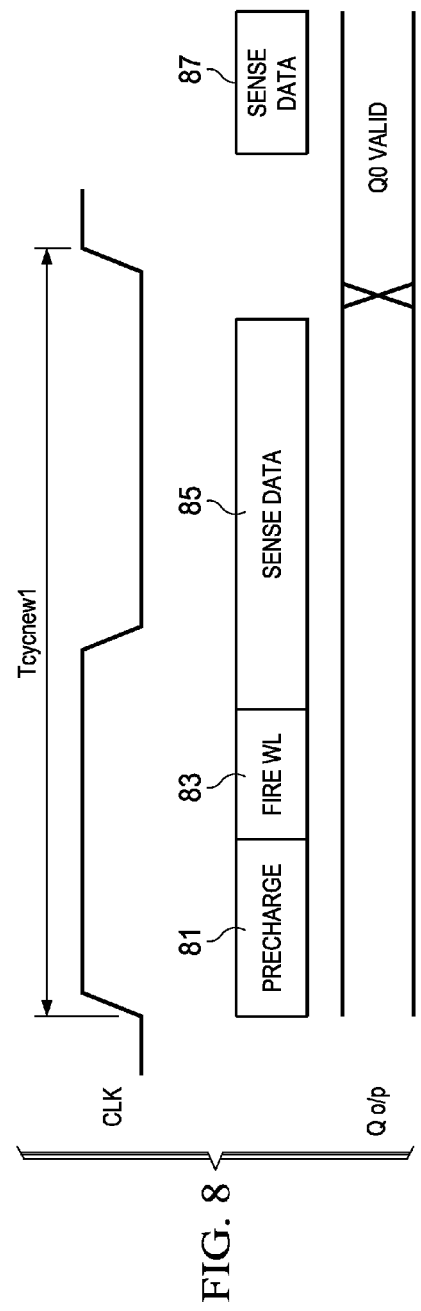
FIG. 8 is a timing diagram of an SRAM device incorporating another aspect of the application.

FIG. 8 is a timing diagram of an SRAM device incorporating another aspect of this application. In FIG. 8, a timing diagram for a sequence of accesses to a series of SRAM cells arranged along a particular row in the SRAM array is depicted. FIG. 8 depicts a "precharge first" mode of operation as an example aspect of this application. In FIG. 8, before the first SRAM cell access to a newly addressed row (or, for a first SRAM access after a power up, reset, or wake up operation), a precharge operation (numbered 81 in FIG. 8) first precharges all the complementary bit line pairs in the SRAM array. The selected row line is determined for the first SRAM cell in the sequential access, and the row decoder fires the selected word line (operation labeled Fire WL, 83). When the word line voltage is raised above a transistor threshold voltage for the SRAM cells disposed along a particular row in the SRAM array, the complementary bit line pairs coupled to the SRAM cells each receive a differential voltage corresponding to the stored data within each of the SRAM cells along the selected row line. The column decoder simultaneously decodes the column portion of the address field and controls the Y-select multiplexer to select the column for the read operation. A sensing operation numbered 85 is then performed, and as shown in FIG. 8, the first read data QO VALID becomes available as the sense amplifiers output the latched sense data.

As shown in FIG. 8, following the first SRAM memory cell access, the second SRAM cell is accessed by selecting the next addressed column (which is on the same row in the SRAM array, and which is optionally adjacent to the column of the previously accessed SRAM cell), in the sequential access. The corresponding bit line pair for this column is then coupled to a sense amplifier, and the differential voltage is sensed (Sense Data, operation 87) and the data from this SRAM cell is output. In an advantageous aspect of example embodiments, the cycle time needed for the second and any subsequent memory accesses to the SRAM cells in the selected row is shorter than the memory access time Tcycnew1 for the first memory access, because the precharge operation and the word line firing is not performed for the subsequent accesses. Advantageously, this is possible because the bit line pairs in the SRAM array already have the differential data for each SRAM cell along the selected row stored on them. Thus, by recognizing that the bit line pairs can act as storage nodes and that the bit line pairs contain the SRAM data for each cell along the selected row after the first access to a memory cell on a particular row, the memory access times can be greatly reduced by simply selecting the bit line pairs for sequential SRAM cells along the same row, and using the sense amplifiers, sensing the data, for each access. In contrast to the memory access cycle illustrated in FIG. 6, the precharge operations and the word line firing of example embodiments can be performed only once for the access to the SRAM cells arranged along a particular row.

Figure 9:
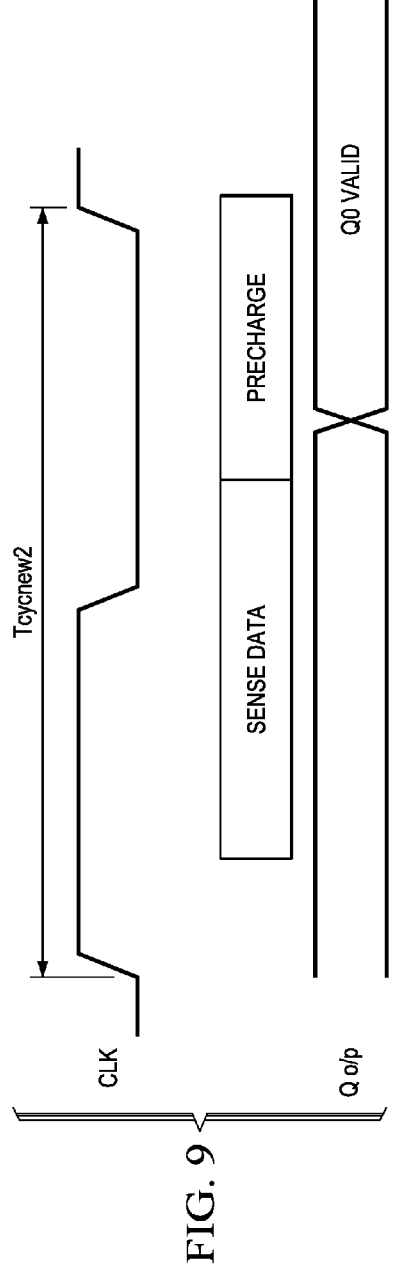
FIG. 9 is a timing diagram of an SRAM device incorporating a different aspect of the application.

FIG. 9 is a timing diagram of an SRAM device incorporating a different aspect of the application. FIG. 9 illustrates in a timing diagram a "precharge last" mode of operation of an arrangement that forms another aspect of this application. In FIG. 9, when the system determines that the present SRAM access is the last access to the SRAM along a particular row of SRAM cells, such as based on the address of the next access that is to be issued for the SRAM, a "precharge last" operation is performed. As shown in FIG. 9, a sensing operation on a row of cells is performed (operation 91). In this aspect of this application, the system knows that this access is the last access to the SRAM cells along this particular row. For example, the system may be aware that the next access to the SRAM is to another row of SRAM cells. Alternatively, the system may know that the next access is not for many cycles, because a program being executed by the system does not require SRAM access. The system can be entering a power save, sleep, or wait mode of operation, and no SRAM accesses are to be performed during these modes. The system can direct the SRAM to perform a "precharge last" to ready the bit line pairs for an access to another row in the SRAM, for example. In FIG. 9, the precharge operation (operation 93) now follows the sense data operation 91. During the precharge last operation, the bit line pairs in the columns of SRAM cells are each coupled to a precharge voltage as is described above by a precharge circuit. Depending on the architecture of the system, the precharge operation can cause a slightly longer cycle time (labeled Tcycnew2) in the memory device. However, if the next system clock cycle does not have a data access, the precharge last operation is transparent to the overall system operation. The data latency time is therefore not affected by the "precharge last" operation.

Figure 10:
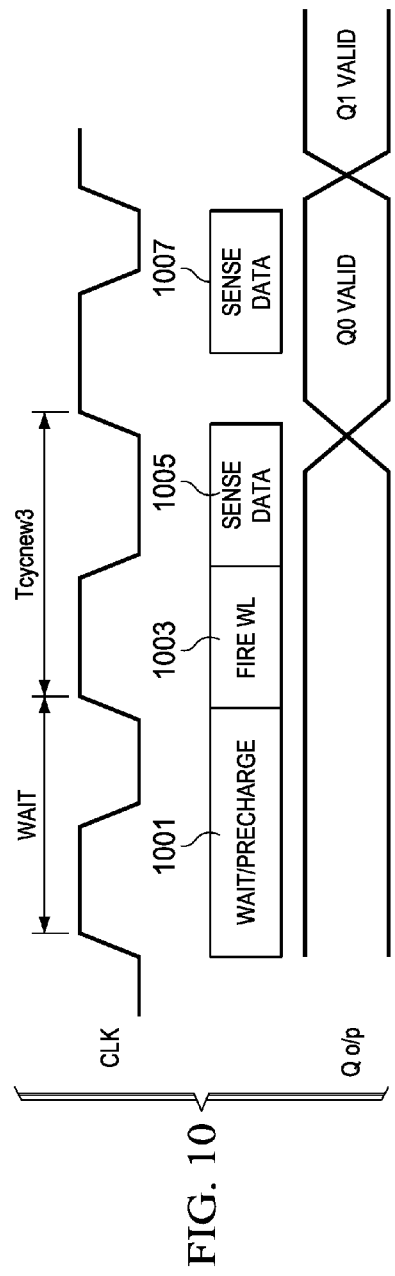
FIG. 10 is a timing diagram of an SRAM device incorporating another aspect of the application.

FIG. 10 illustrates in a timing diagram another arrangement that forms an additional aspect of this application. In FIG. 10, a high performance mode is illustrated for operating the SRAM device. The clock frequency CLK in FIG. 10 is at an approximately constant duty cycle. This arrangement of this application is particularly useful for a high frequency operation in a pipelined architecture where it is important that each clock cycle be of the same overall duration. In accessing a row in the SRAM, the bit lines are first precharged using a "Wait/Precharge" cycle as shown in operation 1001. During the wait precharge cycle, only a precharge is performed. No data access is performed during this cycle. Following the wait precharge cycle, a memory access cycle is performed. Because the bit lines are already precharged for the entire SRAM, no additional precharge is needed and for a sequential access, a word line firing is only needed for the first access for SRAM cells arranged along a particular row. In FIG. 10, operation 1003 "Fire WL" fires the word line in a first access cycle. A "Sense Data" operation 1005 results in the first data word QO appearing as valid data on the SRAM data output Q. Operation 1007 illustrates the next "Sense Data" access to another SRAM cell along the same row line. In the next access in the sequence, no word line firing is necessary because the two SRAM cells are positioned on the same row within the SRAM array. Following the Sense Data operation 1007, the second data word Q1 appears at the data output Q. The two SRAM cells accessed in the sequence are positioned along the same word line WL, and they may be (but are not necessarily) physically adjacent. In an example sequence of SRAM accesses, the two cells can be sequentially addressed, so they can be positioned adjacent to one another.

The operations illustrated in FIG. 10 depict an arrangement that is of particular use with pipelined systems where the data access time is fixed on a high performance cycle. In this arrangement of this application, the clock frequency can be maximized and for these architectures a fixed memory access time Tcycnew3 can be used that is the same for each access. The precharge operation is performed as a separate operation that is done in a "wait" cycle so that the "Clk-to-Q" time is not varied, but instead is fixed for the SRAM accesses. When the clock is running at a high rate, the high performance access of FIG. 10 can be used. However, even in these high performance applications, during a power down, sleep, stand-by or other reduced clock rate operation, a conventional SRAM access type (such as in FIG. 6) can be used, because the "clock-to-Q" time is not critical in those reduced clock rate modes of operation.

FIG. 11 depicts, in a table, an example arrangement of signals that can be used to implement the arrangements described above. However, the various methods of this application are not limited to this example implementation or any particular device architecture. In FIG. 11, an input control signal to an SRAM device is labeled "BM" for "burst mode enable." For an SRAM access, this signal indicates that a sequence of SRAM accesses will be performed, so that (unlike conventional SRAM accesses) the precharge operations and word line firing operations are not to be performed for each SRAM access, but are instead to be performed according to some additional control signals. In FIG. 11, a second control input PCHF indicates, when it is active and the BM signal is also active, that the precharge should be performed only in the first half of the first access cycle in a burst mode operation. When this signal is active, it indicates to the SRAM device that the operation of FIG. 8 is to be performed, the "precharge first" mode of operation, and the word line firing, are performed for the first access to an SRAM cell in a particular row, and subsequent accesses are to be performed using only the column decoders to select the bit line pairs to be sensed by the sense amplifiers.

In FIG. 11, a third control input PCHL is also shown. During a burst mode operation, when this signal is active it indicates to the SRAM that a bit line precharge operation is to be performed in the second half of the access cycle. This operation is used in a burst mode operation to perform a "precharge last" operation such as is illustrated in FIG. 10. Following the next memory cell access, the precharge circuit is operated by the SRAM to precharge the bit line pairs to the precharge voltage. In this manner the bit line are precharged before an access to another different row of SRAM cells, for example.

FIG. 12 is a block diagram of an SRAM device incorporating arrangements for providing aspects of the application. In FIG. 12, the SRAM 1200 can be a stand-alone integrated circuit, or alternatively in system on a chip (SOC) applications or in other embedded memory applications, SRAM 1200 can be an embedded memory circuit included with other functional blocks on a SOC. As illustrated in FIG. 12, the SRAM 1200 has precharge control inputs BM, PCHF, PCHL, in addition to the address input labeled ADDRESS, input data Write Data, Read/Write Control, various power management input signals such as OFF ON, Sleep, as described above. By providing these additional control signals, the SRAM 1200 can be used to implement methods of optimizing the SRAM performance that are aspects of this application. A memory controller (not shown) that is coupled to the SRAM 1200 can signal when a precharge, and a word line firing, are needed. For example, when the signal BM, or burst mode enable, is inactive or low, the SRAM 1200 can operate as a conventional SRAM, and the precharge and word line operations can be performed as shown in FIG. 6, above. When the burst mode enable signal BM is active, at a high voltage for example, the SRAM 1200 performs a precharge operation, and a word line firing, based on the values of the PCHF (precharge first) and PCHL (precharge last) input signals. As described above, a precharge first operation includes a precharge and a word line firing for the first SRAM cell accessed in a burst mode to a particular row, as shown in FIG. 8. A precharge last operation is indicated by the PCHL signal and causes the SRAM 1200 to perform a precharge operation following the current SRAM access, as shown in FIG. 9 for example. These signals can also be used to control the SRAM device 1200 to perform a precharge only cycle, a wait cycle as described above. The use of these signals BM, PCHF, PCHL is an example of one approach to implementing the arrangements of this application, but this example is not limiting, and other signaling arrangements could be used. Control registers placed within the SRAM could be written to indicate what mode of operation the SRAM should perform. Serial control interfaces could be used to save pins on the SRAM 1200 to form additional arrangements, for example.

By providing the memory controller or other system devices additional control over the internal precharge operations performed by the SRAM 1200, the arrangements of this application can advantageously operate to optimize the memory cycle times and to tailor the power consumption to the operations performed. Trade-offs can be made between data latency and SRAM power consumption. For example, the arrangements of this application therefore enable power to be conserved in low frequency operations, while high frequency operations can be optimized to reduce the data latency or memory access times to increase performance. In the arrangements the system or memory controller can cause the SRAM to perform a stand-alone wait and precharge cycle, a precharge first at the beginning of the cycle, or a precharge last at the end of a cycle, as described above. Further, a memory controller can also direct the SRAM to perform a precharge and word line firing in a different (e.g., conventional) access mode when performance optimization is not necessary, such as for a random address access or for a single word access.

Figure 13:
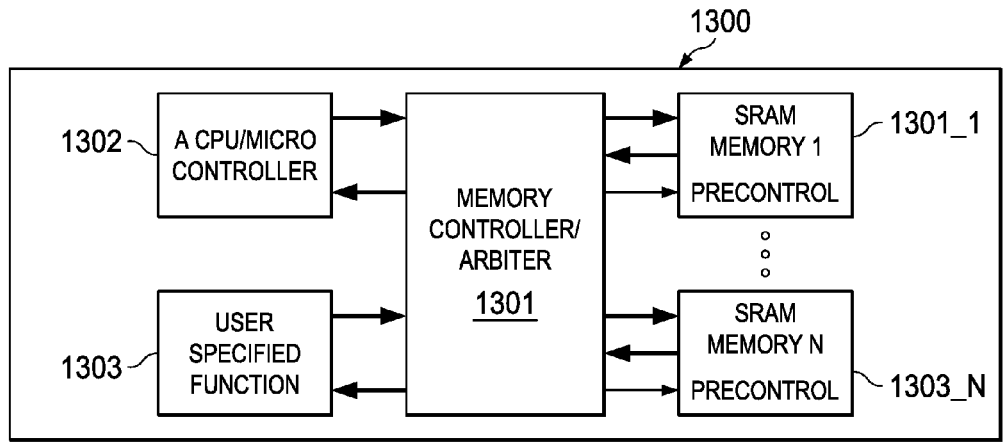
FIG. 13 is a block diagram of a system incorporating SRAM devices including aspects of this application.

FIG. 13 is a block diagram of a system incorporating SRAM devices including aspects of this application. In FIG. 13, a system 1300 is depicted including a memory controller and arbiter 1301 coupled to SRAM memory devices 1303_1 to 1303_N, and a CPU/microcontroller 1302, a user specified function 1303 coupled to the memory controller 1301. In operation, a device makes a request for a memory access to the memory controller 1301. The memory controller 1301 determines whether a burst mode access is being requested and which device SRAM memory 1 to SRAM memory N is being accessed, and outputs control signals including the burst mode and precharge signals BM, PCHF and PCHL to the appropriate device. The system 1300 can be implemented on a circuit board or module, such as using discrete integrated circuits. In additional arrangements that form additional aspects of this application, the system 1300 can be a system on a chip (SOC) or a system in a package (SIP). Stacked die packages and other approaches to packaging integrated devices together can be used to implement system 1300.

Various operations can be performed using method arrangements of example embodiments. In a first low frequency operating mode, a READ/WRITE burst mode can be performed with no wait states. Because the clock frequency is reduced in this low frequency mode, there is no need to perform a precharge only or wait state. Table 1 below illustrates the precharge operations that can be performed between successive operations in burst mode during the low frequency operating mode.

TABLE 1

| LOW FREQUENCY OPERATIONS | FIRST BURST MODE | SECOND BURST MODE | PRECHARGE LAST | PRECHARGE FIRST |
|---|---|---|---|---|
| WRITE-READ | WRITE | READ | NONE | NONE |
| READ-WRITE | READ | WRITE | AFTER READ | OR, BEFORE WRITE |
| READ1-READ2 | READ1 | READ2 | AFTER READ1 | OR, BEFORE READ2 |
| WRITE1-WRITE2 | WRITE1 | WRITE2 | AFTER WRITE1 | NONE |

TABLE 1 illustrates in a first row labeled WRITE-READ the burst mode operations for a burst mode write transitioning to a burst mode read. In this transition, as shown in Table 1, there is no need for a WAIT cycle between the last write and the first read. No precharge is required for the transition.

TABLE 1 illustrates in the second row labeled READ-WRITE a burst mode operation transitioning from a burst mode read to a burst mode write. As shown in TABLE 1, the read should be followed by a precharge last, or, a precharge first should be performed before the first write.

The third row of TABLE 1 labeled READ1-READ2 illustrates a transition from a read operation of SRAM cells in one row to a read of SRAM cells in another row, crossing a column boundary. This transition requires a precharge at the end of the first row, with a precharge last following the last word in the READ1, or with a precharge first before the first read in READ2.

The last row of TABLE 1 labeled WRITE1-WRITE2 illustrates a WRITE to a first row of SRAM cells, WRITE1, transitioning to a write to a second row of SRAM cells, WRITE2. In this transition, as shown in TABLE 1, a precharge last should be performed after the last SRAM cell is written in the first row.

TABLE 2 illustrates operations in a high frequency operation burst mode. In the high frequency operation mode, wait states can be used. In the high frequency operation mode, the precharge first cycle is to be avoided, as this requires a longer cycle time for the first access in a burst of accesses. The precharge first cycle operation adds latency to the first access in a burst mode. In a high frequency operation mode, this variable access time can be advantageously avoided. Instead, a precharge only, or wait state, can be used at operation boundaries. Alternatively a precharge last option can be used to precharge the bit lines and avoid the wait cycles.

used for the high frequency mode of operation. Instead, a wait cycle, which is a precharge only cycle, can be used. In some transitions, a precharge last operation can be performed to precharge the bit lines between transitions, instead of a wait state.

TABLE 2

| HIGH FREQUENCY OPERATIONS | FIRST BURST MODE | SECOND BURST MODE | PRECHARGE LAST | PRECHARGE FIRST | INSERT WAIT STATE |
|---|---|---|---|---|---|
| READ-READ | READ1 | READ IN SAME ROW | OPTIONAL AFTER READ | NONE | BEFORE BURST READ |
| UNKNOWN-READ/WRITE | UNKNOWN MODE | READ/WRITE | NONE | NONE | BEFORE READ OR WRITE |
| WRITE-READ | WRITE | READ | NONE | NONE | NONE |
| READ-WRITE | READ | WRITE | AFTER READ | NONE | OPTIONAL |
| READ1-READ2 | READ1 | READ2 | AFTER READ1 | NONE | AFTER READ1 |
| WRITE1-WRITE2 | WRITE1 | WRITE2 | AFTER WRITE1 | NONE | NONE |

In TABLE 2, the first row labeled READ-READ illustrates a sequential read in the same row for a burst mode read in high frequency mode. In this example, a wait cycle which is a precharge only cycle is performed before the first read in the burst operation. After the wait cycle, the subsequent burst read cycles do not require any additional precharge operations. At the end of the burst read cycle, a precharge last operation can optionally be performed.

In TABLE 2, the second row labeled UNKNOWN-READ/WRITE illustrates a transition from an unknown state to a read or write burst mode operation. In this transition, a wait state which is a precharge only operation is performed before the burst mode read or write. No precharge operation is needed after the wait state is performed. Because the state of the SRAM is unknown in the first stage, the wait cycle precharges all of the bit lines and the SRAM is then ready for burst mode operations that follow the unknown mode. This operation can be advantageously performed after a test mode, a power up, a reset, or a wake operation occurs.

In TABLE 2, the third row labeled WRITE-READ illustrates a transition from a burst mode write to a burst mode read operation. In this transition, no precharge is needed. In TABLE 2, the fourth row labeled READ-WRITE illustrates a transition from a read operation to a write operation. In performing this transition, the precharge can be performed as a wait state operation after the read is performed, or in an alternative arrangement, a precharge last can be performed after the read is performed and before the write operation.

In TABLE 2 the fifth row labeled READ1-READ2 illustrates a burst read mode where a first read operation in a first row, READ1, is followed by a second read operation in a second row READ2. In this transition, a wait state can be performed after the first read, or alternatively a precharge last operation can be performed after the first read. In TABLE 2, the last row labeled WRITE1-WRITE2 illustrates a write to a first row, followed by a write to a cell in another second row. In this transition, the precharge is performed as precharge last operation after the first write.

TABLE 2 illustrates that for each of the high frequency operations, a wait state or a precharge last cycle can be performed. The precharge first cycle, which would change the latency for the first SRAM access in a burst mode, is not In the various arrangements that form aspects of this application, the system is given control of the internal SRAM precharge operations in a burst mode of operation. This enables the system to make trade-offs between data latency and throughput and the power consumed. In low frequency operations, where data latency is not important, the precharge first cycle can be used. The use of the precharge first cycle delays the data in a first access by extending the clock-to-Q time in the first memory access cycle. In high frequency modes of operation, wait states can be used, which then enable the clock-to-Q time to be shortened for each of the SRAM accesses. Further the memory access cycle times in the high frequency mode can be maintained at a constant duty cycle, avoiding any variable access cycle times. In pipelined systems this aspect of this application can be particularly advantageous.

Because the system or memory controller can determine when memory accesses are to SRAM cells in the same row, the memory controller can operate the SRAM to insert a wait state or a precharge last cycle when a transition across a column boundary (changes the row being used) is to be performed.

Figure 14:
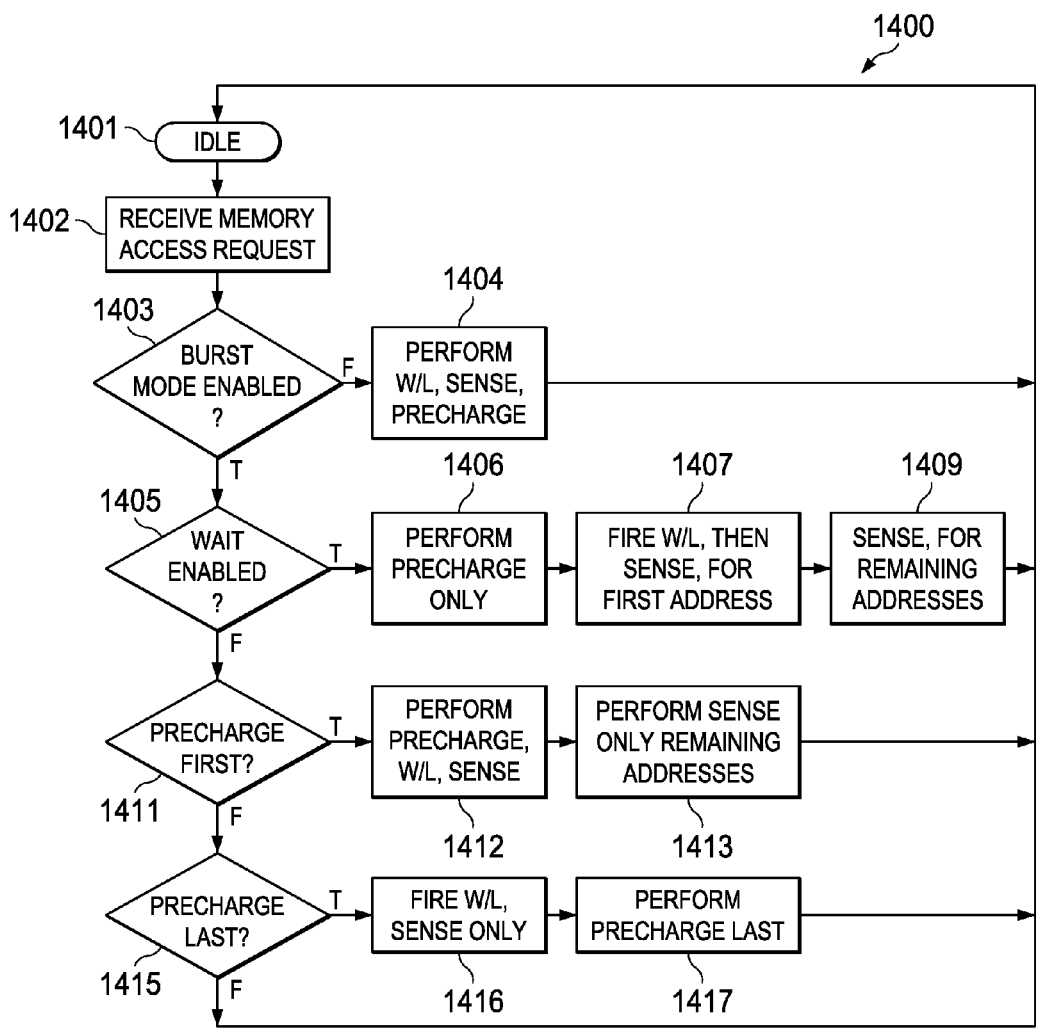
FIG. 14 is a flow diagram illustrating steps of an example method illustrating an arrangement for providing aspects of this application.

FIG. 14 is a flow diagram illustrating steps of an example method illustrating an arrangement for providing aspects of this application. In FIG. 14, method 1400 depicts the operations of an example memory controller and SRAM arrangement incorporating features of this application. The method 1400 begins at step 1401 in an Idle mode. At step 1402, Receive Memory Access Request, a memory access request is received. At step 1403, Burst Mode Enabled?, a conditional test is made to determine whether the burst mode is enabled. In the example arrangements described above, this can be done by sampling the input signal BM. In FIG. 14, if the BM is not enabled, the method then transitions to step 1404, and a different (e.g., conventional) access is performed. When the different SRAM access is completed, the method transitions to the Idle state 1401.

If the burst mode is enabled at step 1403, the method transitions to step 1405, Wait Enabled?. At step 1405, if the condition is true, then the method transitions to step 1406, and a precharge only cycle is performed. After the precharge only cycle is performed at step 1406, the method transitions to step 1407. At step 1407, a word line is fired, and then a sense operation is performed for the first SRAM access in a burst mode of operation. At step 1409, the remaining addresses in the burst mode are accessed using only sensing operations, and no precharge or word line firing is required.

At step 1411, a Precharge First? determination is made. If the precharge first is to be performed at step 1411, then the method transitions to step 1412. In step 1412, a first memory access cycle begins with a precharge, then a word line is fired, and a sense data operation is performed. Following the first access at step 1412, the method transitions to step 1413, where a sense data operation only is performed for the remaining SRAM cell addresses in the burst mode of operations. The method then transitions back to step 1401, Idle.

At step 1415, a determination is made whether a Precharge Last? operation is to be performed. If the condition is false, the method transitions back to state 1401, Idle. If the condition at step 1415 is true, the method transitions to step 1416, and a word line is fired in the first access cycle, followed by sense data operations for each of the remaining addresses in the burst operation. After the last SRAM cell is accessed in the burst in state 1416, a precharge last operation is performed at step 1417. The method then transitions back to state 1401, or Idle.

FIG. 14 depicts an example arrangement for performing certain methods of this application. Various modifications can also be made in the order of steps and in the number of steps to form additional arrangements that incorporate aspects of this application, and these modifications will form additional alternative arrangements that are contemplated as part of this application.

Modifications are possible in the described embodiments, and other embodiments are possible, within the scope of the claims.

What is claimed is:

1. A memory controller circuit, external to and coupled to a static random access memory (SRAM) circuit, to control read and write data accesses to the SRAM circuit by outputting a precharge control signal to the SRAM circuit, the memory controller circuit comprising:
   precharge mode control circuitry to output: a burst mode enable signal to the SRAM circuit indicating that a series of SRAM cells along a selected row of SRAM cells will be accessed; a precharge first mode signal to the SRAM circuit indicating that a first access along the selected row will occur; and a precharge last mode signal to the SRAM circuit indicating that a last access along the selected row will occur;
   the SRAM circuit including an array of SRAM cells arranged in rows and columns to store data, each SRAM cell coupled to a corresponding word line along a row of SRAM cells, and each SRAM cell coupled to a corresponding pair of complementary bit lines to output a differential voltage corresponding to a stored datum on the corresponding pair of complementary bit lines responsive to a row select voltage on the corresponding word line;
   wherein the memory controller circuit is coupled to cause a precharge circuit to precharge the corresponding pair of complementary bit lines to a precharge voltage responsive to the precharge control signal.

2. The memory controller circuit of claim 1, wherein the SRAM circuit includes bitline precharge circuitry to couple the corresponding pair of complementary bit lines to the precharge voltage before each access along the selected row, responsive to a first state of the burst mode enable signal.

3. The memory controller circuit of claim 1, wherein the SRAM circuit includes bitline precharge circuitry to couple the corresponding pair of complementary bit lines to the precharge voltage for the first access, and to not couple the corresponding pair of complementary bit lines to the precharge voltage for subsequent accesses along the selected row, responsive to a second state of the burst mode enable signal.

4. A memory controller circuit, external to and coupled to a static random access memory (SRAM) circuit, to control read and write data accesses to the SRAM circuit by outputting a precharge control signal to the SRAM circuit, the memory controller circuit comprising:
   high frequency precharge mode control circuitry to output the precharge control signal to the SRAM circuit responsive to a clocking frequency over a predetermined threshold, wherein the high frequency precharge mode control circuitry is further to output a precharge only cycle control signal to the SRAM circuit;
   the SRAM circuit including an array of SRAM cells arranged in rows and columns to store data, each SRAM cell coupled to a corresponding word line along a row of SRAM cells, and each SRAM cell coupled to a corresponding pair of complementary bit lines to output a differential voltage corresponding to a stored datum on the corresponding pair of complementary bit lines responsive to a row select voltage on the corresponding word line;
   wherein the memory controller circuit is coupled to cause a precharge circuit to precharge the corresponding pair of complementary bit lines to a precharge voltage responsive to the precharge control signal.

5. The memory controller circuit of claim 4, wherein the SRAM circuit includes:
   an address input to receive an address indicating at least one SRAM cell to be accessed;
   a read/write input to receive a read/write control signal indicating whether an access to the SRAM circuit is a read access or a write access;
   a data input to receive write data to be written into at least one SRAM cell;
   a data output to output read data retrieved from at least one SRAM cell;
   a row decoder circuit to receive a first portion of the address input and output a row select voltage on a word line for a selected row of SRAM cells that is indicated by the first portion of the address input;
   a column decoder circuit to decode a second portion of the address input and output Y-select signals corresponding to a column of SRAM cells that is indicated by the second portion of the address input; and
   a column select multiplexer to receive the Y-select signals and to couple a pair of complementary bit lines in the column indicated by the second portion of the address input to a sense amplifier to sense a differential voltage on the pair of complementary bit lines and to amplify the differential voltage and to output a logic level voltage to the data output.

6. The memory controller circuit of claim 4, further comprising low frequency precharge mode control circuitry to output signals for controlling precharge cycles in the SRAM circuit responsive to a clocking frequency below the predetermined threshold.

7. The memory controller circuit of claim 6, wherein the low frequency precharge mode control circuitry is further to output a burst mode enable signal to the SRAM circuit indicating that a series of SRAM cells along a selected row of SRAM cells will be accessed.

8. The memory controller circuit of claim 7 wherein the low frequency precharge mode control circuitry is further to output a precharge first mode signal to the SRAM circuit indicating that a first access along the selected row will occur.

9. The memory controller circuit of claim 8 wherein the low frequency precharge mode control circuitry is further to output a precharge last mode signal to the SRAM circuit indicating that a last access along the selected row will occur.

10. A method of operating a precharge circuit coupled to pairs of complementary bit lines in an array of static random access memory (SRAM) cells, the SRAM cells being arranged in rows and columns to store data, each SRAM cell coupled to a corresponding word line along a row of SRAM cells, and each SRAM cell coupled to a corresponding pair of complementary bit lines, the method comprising:
   in a burst mode, operating the precharge circuit to precharge the pairs of complementary bit lines once per burst access to a series of SRAM cells along a selected row of SRAM cells;
   in a different mode, operating the precharge circuit to precharge the corresponding pair of complementary bit lines per access to an SRAM cell; and
   in a wait cycle mode, operating the precharge circuit to precharge one or more of the pairs of complementary bit lines before one or more of the SRAM cells is accessed.

11. The method of claim 10, wherein in the burst mode, the precharge circuit is operated once before a first access along the selected row.

12. The method of claim 10, wherein in the burst mode, the precharge circuit is operated once after a last access along the selected row.

13. The method of claim 10, wherein in the burst mode, a word line is activated once before a first access along the selected row.

14. A memory controller circuit, external to and coupled to a static random access memory (SRAM) circuit, to output a precharge control signal, the memory controller circuit comprising:
   a controller to: in a burst mode, output the precharge control signal once per burst access to a series of SRAM cells along a selected row of SRAM cells; in a different mode, output the precharge control signal per access to an SRAM cell; and output the precharge control signal before access to an SRAM cell following a power up of the SRAM circuit;
   the SRAM circuit including an array of SRAM cells arranged in rows and columns to store data, a plurality of word lines respectively coupled to the rows, a plurality of complementary bit line pairs respectively coupled to the columns, and a precharge circuit coupled to precharge the complementary bit line pairs responsive to the precharge control signal.

* * * * *